United States Patent
Redman-White

(10) Patent No.: US 6,208,173 B1
(45) Date of Patent: Mar. 27, 2001

(54) PEAK DETECTOR

(75) Inventor: William Redman-White, Hampshire (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 08/883,732

(22) Filed: Jun. 27, 1997

(30) Foreign Application Priority Data

Jun. 28, 1996 (GB) .................................................. 9613634

(51) Int. Cl.[7] .................................................. G11C 7/06
(52) U.S. Cl. .................................. 327/59; 327/61; 327/62
(58) Field of Search .................................. 327/58, 59, 60, 327/61, 62, 354, 91, 94, 95, 96

(56) References Cited

U.S. PATENT DOCUMENTS

| 4,560,940 | * | 12/1985 | Van Der Schans | 327/60 |
| 4,564,804 | | 1/1986 | Wilke et al. | 324/103 |
| 4,990,912 | | 2/1991 | Selwa | 341/132 |
| 5,025,176 | * | 6/1991 | Takeno | 327/58 |
| 5,302,863 | * | 4/1994 | Walley et al. | 327/60 |
| 5,428,307 | * | 6/1995 | Dendinger | 327/62 |

FOREIGN PATENT DOCUMENTS

| 63-171369 | 7/1988 | (JP) . |
| 06066846 | 3/1994 | (JP) . |

* cited by examiner

Primary Examiner—Toan Tran
(74) Attorney, Agent, or Firm—Steven S. Rubin

(57) ABSTRACT

A peak detector comprises a device for storing a value representing the currently detected peak amplitude ($C_p, C_n$), a circuit for detecting whether the input signal amplitude exceeds the stored value (D1 to D4), an apparatus for updating the stored value at a fast rate if the input signal amplitude exceeds the stored value by more than a given value (D1/V1, D3/V4), and an apparatus for updating the stored value at a slow rate if the input signal amplitude exceeds the stored value by less than the given value (D2/R2, D3/R3). Analogue and digital versions are described together with their application to data slicers in, for example, teletext decoders.

21 Claims, 6 Drawing Sheets

PEAK DETECTOR

BACKGROUND OF THE INVENTION

1. Field of the Invention

This invention relates to a peak detector for detecting the magnitude of the peak of a signal applied to an input of the detector.

2. Description of Related Art

In many data systems it is desirable to get a rapid estimate of the amplitude in order to obtain slicing levels early in a signal burst, but producing a very sensitive and fast detector means that the noise bandwidth is large and that the signal amplitude can easily be over-estimated. Thus, there is a basic incompatibility of two requirements. That is, a rapid following of the peak to monitor the maximum amplitude of the signal is desirable but a slower response is required to prevent the occurrence of noise spikes from unduly affecting the detected peak value. One application of such a peak detector is in a data slicer, particularly for teletext signals. In this application a fast estimation of the amplitude of the signal is required in order to generate a data slicing level. This estimate is normally derived from the clock run-in signal which has a limited duration and hence the peak detector needs to be able to detect the peaks relatively quickly. If, however, there are noise spikes on the signal these are likely to generate incorrect data slicing levels if the peak detector reacts too quickly to them.

SUMMARY OF THE INVENTION

It is an object of the invention to enable the provision of a peak detector which quickly captures the peak value of the input signal but which does not react quickly to moderate amounts of noise on the signal.

The invention provides a peak detector for detecting the peak amplitude of an input signal, the peak detector comprising storage means for storing a value representing the currently detected peak amplitude, means for detecting whether the input signal amplitude exceeds the stored value, means for updating the stored value at a first (fast) rate if the input signal amplitude exceeds the stored value by more than a given value, and means for updating the stored value at a second (slower) rate if the input signal amplitude exceeds the stored value by less than the given value.

By this means the peak detector will follow a fast edge of an input signal until it reaches a value close to its peak value since under these circumstances the difference between the input signal and the stored value will be relatively large. As the input signal approaches its peak value the difference between the input signal and the stored value will decrease and when the given value is reached the updating of the stored value will take place at a slower rate. Thus, a very fast coarse estimate of the peak value is made up to a large fraction of the true peak level and after this level is reached the detector reacts more slowly to the further error input and hence does not react quickly to moderate amounts of noise on the signal.

In many applications the input signal will have a nominal peak value and in such a case the given value may lie between 10 and 30% of the nominal peak value of the input signal. The precise value of the given value may be a function of the particular application. The greater the proportion of the nominal peak value that is allocated to the given value the slower the actual following of the peak will be but the greater the noise margin will be. Consequently, the choice is between a rapid approach to the peak value and maximum immunity to noise.

The peak detector may comprise a differential pair of transistors, a capacitor, means for applying the input signal to the control electrode of the first transistor, means for connecting the capacitor between the control electrode of the second transistor and a first supply rail, means for charging the capacitor at a rate determined by the current conducted by the main current path of the second transistor and further charging means for providing a further charging current for the capacitor when the input signal voltage exceeds the voltage across the capacitor by more than the given value.

The further charging means may comprise a further transistor connected between a second supply rail and the capacitor, said further transistor being controlled to supply a charging current to the capacitor when the input signal voltage exceeds the voltage across the capacitor by a given amount.

The first transistor may have a constant current source load and may be further connected to the control electrode of the further transistor, the further transistor becoming conductive when the first transistor attempts to conduct a current greater than that produced by the constant current source.

A peak detector as set forth in the three preceding paragraphs provides an analog implementation of a peak detector according to the invention. The invention is, however, by no means restricted to analog implementations, although clearly the input signal may in most cases be an analog value.

In a partially digital implementation of a peak detector according to the invention, the storage means may comprise an accumulator, the means for updating the stored value at the first rate comprising means for adding a first number N to the accumulator and the means for updating the stored value at the second rate may comprise means for adding a second number M to the accumulator, where N is greater than M. M may be equal to 1.

Such a peak detector may comprise first and second comparators, means for feeding the input signal to first inputs of the first and second comparators, means for feeding the outputs of the accumulator to a second input of the second comparator, means for adding the given value to the output of the accumulator and feeding it to the second input of the first comparator, means for adding N to the accumulator when the input signal is greater than the signal at the second input of the first comparator and means for adding M to the accumulator when the input signal is greater than the signal at the second input to the second comparator and less than the signal at the second input of the first comparator.

The output of the accumulator may be fed to the first and second comparators via a digital to analog converter.

A further implementation of a peak detector comprises first and second digital to analog converters, the output of the accumulator being converted by the first digital to analog converter and fed to the second input of the second comparator, means for adding the given value to the output of the accumulator and applying the summed value to the second digital to analog converter and means for applying the output of the second digital to analog converter to the second input of the first comparator.

In this arrangement the offset between the second inputs of the first and second comparators is achieved by means of having two digital to analog converters and applying a digital offset to the accumulator output before applying it to one of the digital to analog converters. This gives the advantage that it is not necessary to produce an analog offset between the second inputs of the first and second comparators.

The peak detector may comprise a comparator having first and second inputs and first and second outputs, the first and second outputs having separate switching points dependent on different input voltage differences between the two inputs, the first output causing the number N to be added to the accumulator and the second output causing the number M to be added to the accumulator.

The comparator may comprise a transconductance stage having first and second current outputs, first and second trans-impedance stages each comprising an inverter and an offset generator comprising a current sink which sinks a fixed current from the second output of the transconductance stage.

This arrangement allows use of a single comparator and enables the offset to be generated in a simple manner occupying very little area on an integrated circuit.

The invention further provides a data slicer including a peak detector according to the invention. Such a data slicer may comprise means for feeding an input signal to a first positive peak detector and a second negative peak detector, means for generating a slicing level intermediate the positive and negative peak values and means for comparing the input signal with the slicing level and producing a data signal from said comparison.

The invention still further provides a teletext decoder including such a data slicer.

BRIEF DESCRIPTION OF THE DRAWINGS

The above and other features and advantages of the invention will be apparent from the following description, by way of example, of embodiments of the invention with reference to the accompanying drawings, in which.

DESCRIPTION OF THE PREFERRED EMBODIMENTS

Figure 1:
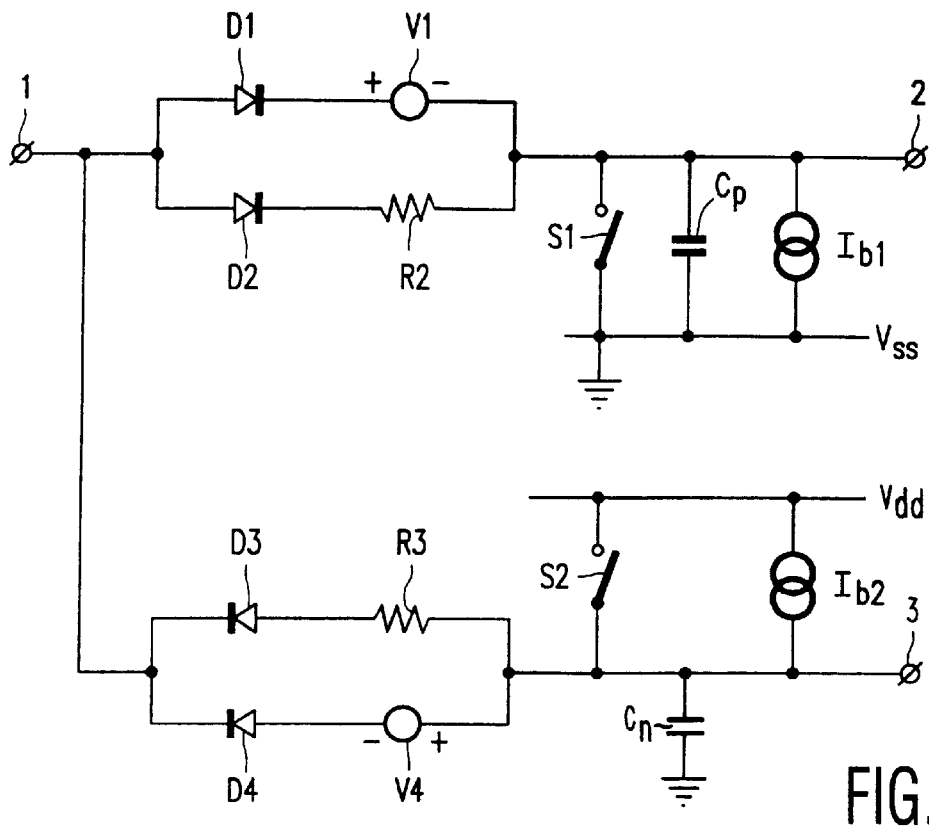
FIG. 1 shows the behavioural concept of a peak detector according to the invention.

FIG. 1 is a diagram showing the behavioural concept of the peak detector according to the invention. The peak detector shown in FIG. 1 is capable of detecting both positive and negative peaks in a signal applied to an input 1 of the circuit. The input 1 is connected to the junction of two ideal diodes D1 and D2, the diode D2 being connected in series with a resistor R2 and the diode D1 being connected in series with an offset voltage generator V1. The junction of the offset voltage generator V1 and the resistor R2 is connected to one side of a capacitor $C_p$ whose other side is connected to a negative supply rail $V_{ss}$. A switch S1 is connected across the capacitor $C_p$ while a bleed current path $I_{b1}$ is also connected across the capacitor $C_p$. The junction of the offset voltage generator V1 and resistance R2 is connected to an output 2 from which an indication of the value of the positive peak of the signal applied to the input 1 is available. The input 1 is also connected to the junction of two diodes D3 and D4, the diode D3 being connected in series with a resistor R3 while the diode D4 is connected in series with an offset voltage generator V4. The junction of resistance R3 and offset generator V4 is connected to one side of a capacitor $C_n$ whose other side is connected to the negative supply rail $V_{ss}$ or ground. A switch S2 is connected between positive supply rail $V_{dd}$ and the junction of resistance R3 and offset generator V4, as is a current bleed circuit $I_{b2}$. The junction of resistance R3 and offset generator V4 is connected to an output 3 at which the negative peak value of the signal is available.

In the circuit of FIG. 1 the fast response part is modelled as an ideal diode with negligible series resistance and with an offset voltage generator in series. This offset voltage is preferably between 10% and 30% of the nominal peak value of the input signal and in the present case has a value which may be, for example 20% of the signal amplitude expected. Thus the capacitor $C_p$ will be rapidly charged by the input signal through the diode D1 until the voltage across the capacitor reaches that of the input signal minus 20%. Once this stage is reached the diode D1 is no longer conductive and any further charging of capacitor $C_p$ is effected through the diode D2 and resistance R2. This resistance will set the bandwidth of the detector when it is settling close to the final value of the input signal. The bleed resistance path $I_{b1}$ will allow a slow decay of the charge on the capacitance $C_p$ so that successive peaks of the input signal can be tracked. The switch S1 forms a reset function and when it is closed the capacitance $C_p$ is totally discharged. Consequently, the peak detector will then operate from a zero level signal. The diodes D3 and D4, resistance R3, and offset generator V4 similarly charge the capacitance $C_n$ to give the negative peak of the input signal.

Figure 3A:
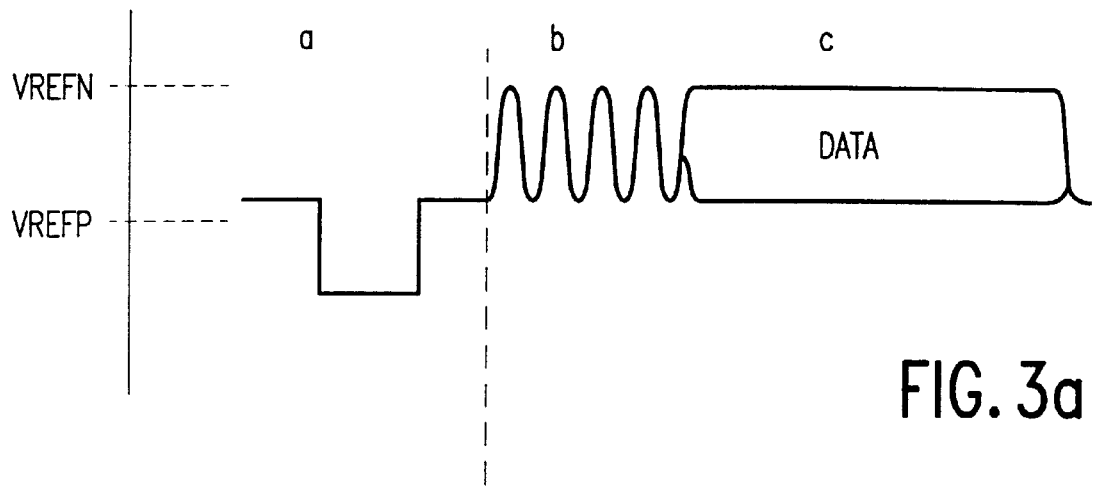
FIG. 3a shows a line of a teletext signal and FIGS. 3b and 3c show the response of a peak detector according to the invention to the application of the teletext signal.

FIG. 3a shows one of the lines of the vertical blanking interval of a combined video and blanking signal containing teletext signals. The line comprises a first portion a which comprises the synchronising pulse and blanking period, a second portion b which comprises a clock run-in switches S1 and S2 are opened and signal containing a number of cycles of the clock signal and a third portion c) which comprises teletext data.

Figure 2:
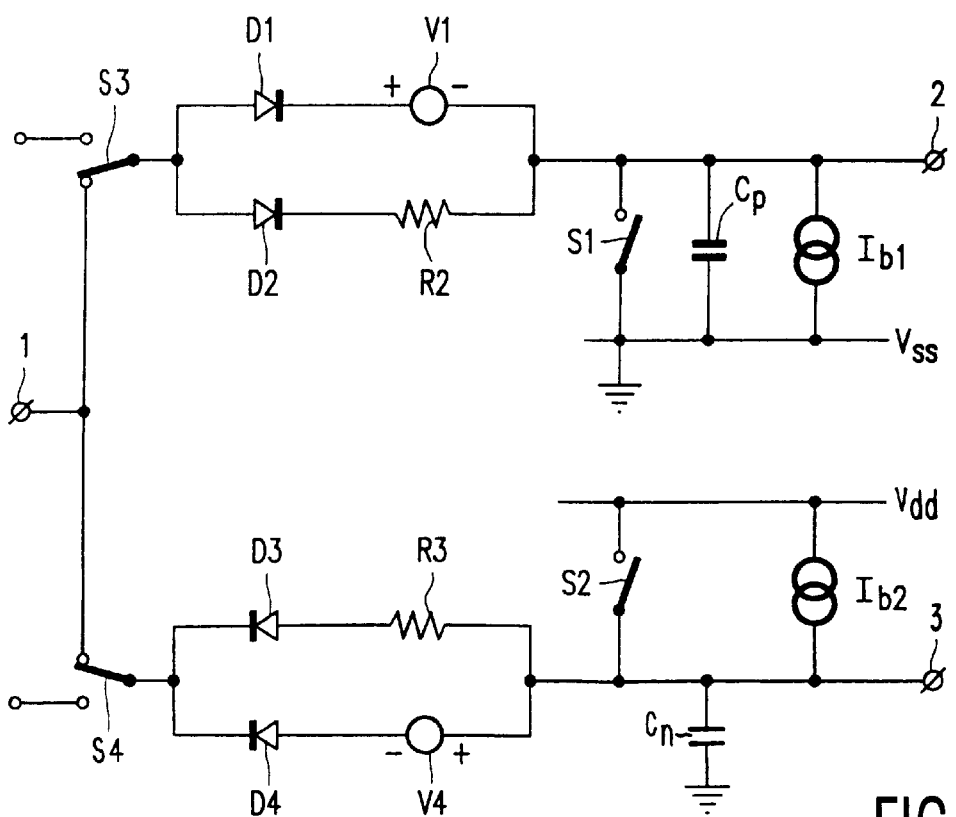
FIG. 2 shows a modification of FIG. 1 in which a storage capacitor is pre-charged prior to the application of the signal whose peak is to be detected.
Figure 3B:
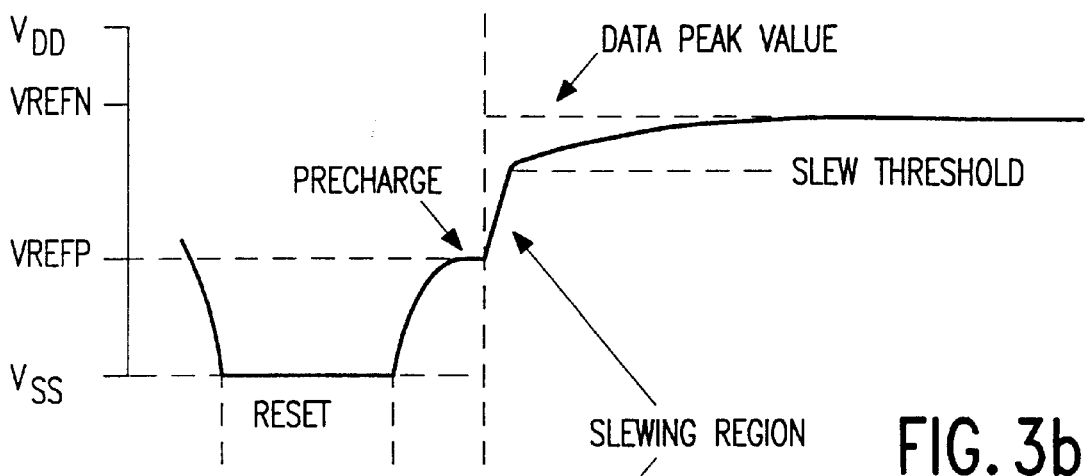
Figure 3C:
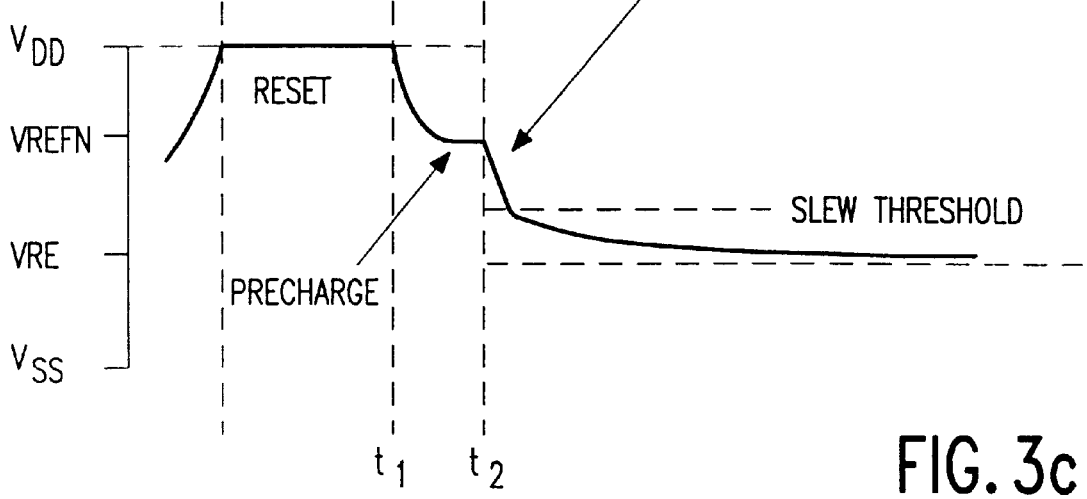

FIGS. 3b and 3c illustrate the waveforms in the positive and negative peak detectors shown in FIG. 2 when acting on the signals shown in FIG. 3a.

FIG. 2 shows the conceptual diagram of a peak detector for this combined video and blanking signal. The format of FIG. 2 is essentially the same as that of FIG. 1. The refinement of FIG. 2 consists in two input switches S3 and S4. During a period $t_1$ in the portion a, which corresponds to the synchronising pulse, the switches S1 and S2 are closed to reset the peak detectors. During a period $t_2$ in the portion a, which extends from the end of the synchronising pulse until the start of the clock run-in, switches S1 and S2 are opened and switches S3 and S4 are switched so that the positive peak detector has the voltage $V_{ref}p$ applied to it while the negative voltage detector has the voltage $V_{ref}n$ applied to it. This pre-charges the capacitances $C_p$ and $C_n$ to the levels $V_{ref}p$ and $V_{ref}n$. This is of course not essential but it does aid the speed of detection of the peak. As can be seen from FIG. 3b the positive peak detector is reset to the voltage $V_{ss}$ during the portion $t_1$ of period a, is pre-charged to the value $V_{ref}p$ during the portion $t_2$ of the period a, and then quickly follows the first peak of the clock run-in signal up to approximately 80% of the expected peak value. This is caused by the capacitor $C_p$ being charged through the ideal diode D1 until it reaches the peak voltage of the clock signal minus the voltage produced by the offset generator V1. From then on charging of capacitor $C_p$ takes place through the series arrangement of diode D2 and resistor R2. The value of the resistance will set the bandwidth of the detector once it has settled close to the final value. Essentially the same process takes place in the negative peak voltage detector which is reset to the value $V_{dd}$ during the portion $t_1$ of the period a, and pre-charged to the value $V_{ref}n$ during the portion $t_2$ of the period a. It then quickly follows the negative going excursion of the clock signal until it reaches the peak value minus the voltage generated by the offset voltage generator V4. The capacitor $C_n$ is then charged through diode D3 and resistor R3 in a similar manner to the way in which the capacitor $C_p$ is charged through D2 and resistor R2.

It can be seen that the response to the first cycle of the clock run-in is fast up until close to the peak value of the clock run-in signal and then follows slowly until the final value is reached. Thus a fast response up to a significant portion of the input amplitude is obtained but noise sensitivity can be reduced since the response within a fixed band close to the peak value will be slow. In this particular embodiment the final band is approximately 20% of the peak value, but this is only an illustrative value and the precise value will be chosen according to a particular application and environment.

Figure 4:
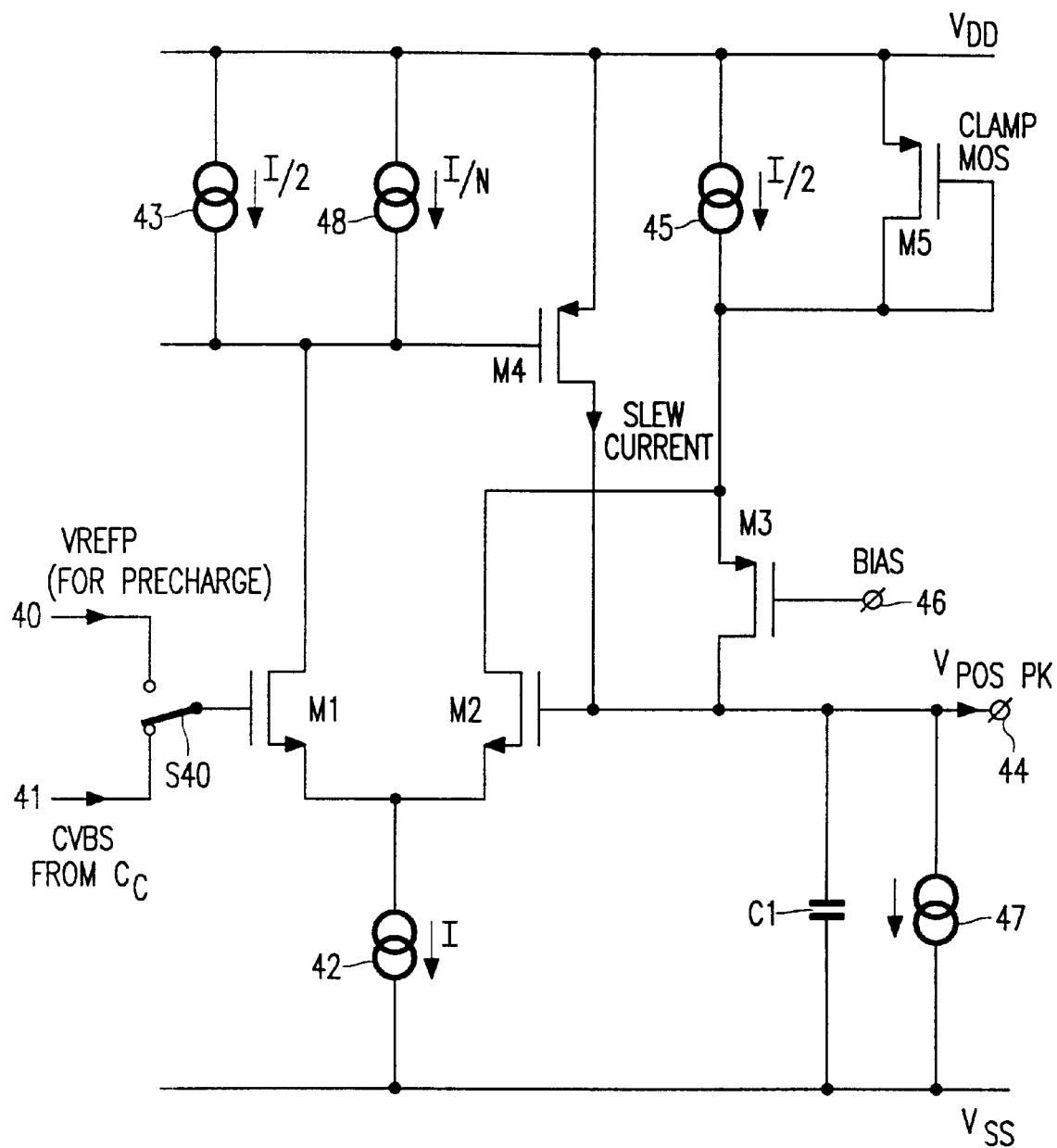
FIG. 4 is a circuit diagram of a first embodiment of a practical peak detector circuit according to the invention.

FIG. 4 is a circuit diagram of a practical circuit for a positive peak detector which operates according to the principles of the circuit shown in FIGS. 1 and 2. As shown in FIG. 4 an input 40 is connected via a switch S40 to the gate electrode of an n-channel field effect transistor M1. The input 40 receives the reference voltage $V_{ref}p$. A second input 41 receives the CVBS signal and is connected to a second contact of the switch S40. The switch S40 is controlled to connect the input 40 to the gate electrode of transistor M1 during at least the portion $t_2$ of period 1 and to connect the input 41 to the gate electrode of transistor M1 for the portions b and c of the line. The source electrode of transistor M1 is connected via a current source 42 to the supply rail $V_{ss}$. A further n-channel field effect transistor M2 has its source electrode also connected via the current source 42 to the supply rail $V_{ss}$. The drain electrode of transistor M1 is connected via a current source 43 to the supply rail $V_{dd}$. The drain electrode of transistor M1 is further connected to the gate electrode of a p-channel field effect transistor M4, the source electrode of which is connected to the supply rail $V_{dd}$. The drain electrode of transistor M4 is connected to the gate electrode of transistor M2 and also to an output 44 at which the positive peak value is made available. A current source 45 is connected in series with the source-drain path of a p-channel field effect transistor M3 between the supply rail $V_{dd}$ and the output terminal 44. A further p-channel field effect transistor M5 has its source electrode connected to the supply rail $V_{dd}$ and its gate and drain electrodes connected to the junction of the current source 45 and the source electrode of transistor M3. The drain electrode of transistor M2 is also connected to the source electrode of transistor M3. The gate electrode of transistor M3 is connected to a bias potential via a terminal 46. A capacitor C1 is connected between the gate electrode of transistor M2 and the supply rail $V_{ss}$ while a current sink 47 is connected between the gate electrode of transistor M2 and the supply rail $V_{ss}$. The current sources 43 and 45 produce a current of i/2 while the current sink 42 conducts the current i. A further current source 48 is connected between the supply rail $V_{dd}$ and the gate electrode of transistor M4. This current source 48 produces the current i/N.

Transistors M1, M2 and M3 together with capacitor C1 form a positive peak detector based on an unbalanced folded cascode amplifier. When the gate electrodes of transistors M1 and M2 are at equal potentials, the current through transistor M2 is equal to i/2 and hence no current flows in transistor M3. As a result no current will flow into capacitor C1. If the voltage at the gate electrode of transistor M1 is lower than that at the gate electrode of transistor M2 the current in transistor M2 will tend to be larger than i/2 and consequently no current will flow into the capacitor C1 since all the current from the current source 45 will flow through the transistor M2. Transistor M5 is used as a clamp to source the difference current through transistor M2 and so to limit internal voltage excursions which would otherwise occur when transistor M2 tries to draw more current than that available from the current source 45. It will of course be recognised that when the potential at the gate electrode of transistor M1 is equal to or less than that at the gate electrode of transistor M2, the input voltage is at a lower value than that across capacitor C1. That is, the voltage stored on capacitor C1 is the peak value to which the input signal has risen in the past. When, however, the voltage at the gate electrode of transistor M1 is higher than that at the gate electrode of transistor M2 the input signal is greater than that stored on capacitor C1. It will cause the current in transistor M2 to be less than i/2 and the difference current will flow into the capacitor C1 via the transistor M3. This peak detector circuit acts as a linear transconductance in its active state and therefore sets, together with the value of the capacitance C1, a given bandwidth. The current source 48 is used to detect the error between the stored value on capacitor C1 and the incoming value, that is the value of the input signal. Thus when a positive input is received on the gate electrode of transistor M1 that exceeds the stored value, the drain of transistor M1 will stay close to $V_{dd}$ until its drain current reaches i/2+i/N. Beyond this point the voltage at the drain electrode of transistor M1 will fall rapidly and cause transistor M4 to be turned on. This conducts current into the capacitor C1 until the gate of transistor M2 rises sufficiently to take current back from transistor M1. Whereupon transistor M4 will be turned off and the detector will return to a linear operation mode.

Thus, in summary, if the input voltage is above the voltage across the capacitor C1 current will flow into capacitor C1 to raise its potential until it reaches that of the input signal. If the input signal is very much higher than the potential on capacitor C1 then transistor M1 will attempt to conduct a current greater than i/2+i/N. This causes transistor M4 to switch on and conduct a large current into capacitor C1. This current is dependent only on the "on resistance" of transistor M4. If, however, the input voltage is only slightly greater than that on capacitor C1 the current that transistor M1 tries to conduct will be less than or equal to i/2+i/N and transistor M4 will not conduct. Consequently, the current fed to capacitor C1 will be i/2 $-I_{M2}$, where $I_{M2}$ is the current conducted by transistor M2 which is set by the $g_m$ of the differential pair. The value of the current source 48, that is the value of N, can be used to set the threshold between the fast charging of capacitor C1 through transistor M4 and the slower charging of capacitor C1 through transistor M3. This is directly analogous to the two branches of the diode circuit shown in FIG. 1.

The input signal at input 40 may typically be the voltage $V_{ref}p$ which will be delivered from a synchronisation separator circuit, while the input to terminal 41 may be a combined video and blanking signal. The switch S40 is an optional feature and merely allows a more rapid capture of the signal peak when using the peak detector to detect the clock run-in signal of a teletext signal. In other applications such a switch and pre-charging of the capacitance C1 may not be necessary, and even when peak detecting teletext signals, depending on the performance required, the provision of the pre-charging of capacitor C1 may be omitted.

FIG. 4 illustrates a peak detector which will detect positive peaks. It will be clear to the person skilled in the art that a similar circuit may be used for detecting negative peaks. In this case transistors M1 and M2 would be replaced by a pair of p-channel field effect transistors having their tail connected to the supply rail $V_{dd}$ while transistors M3 and M4 would be replaced by N-channel field effect transistors having their source electrodes connected to the supply rail $V_{ss}$. The capacitor C1 would again be connected between the gate electrode of transistor of M2 and the supply rail $V_{ss}$.

Figure 5:
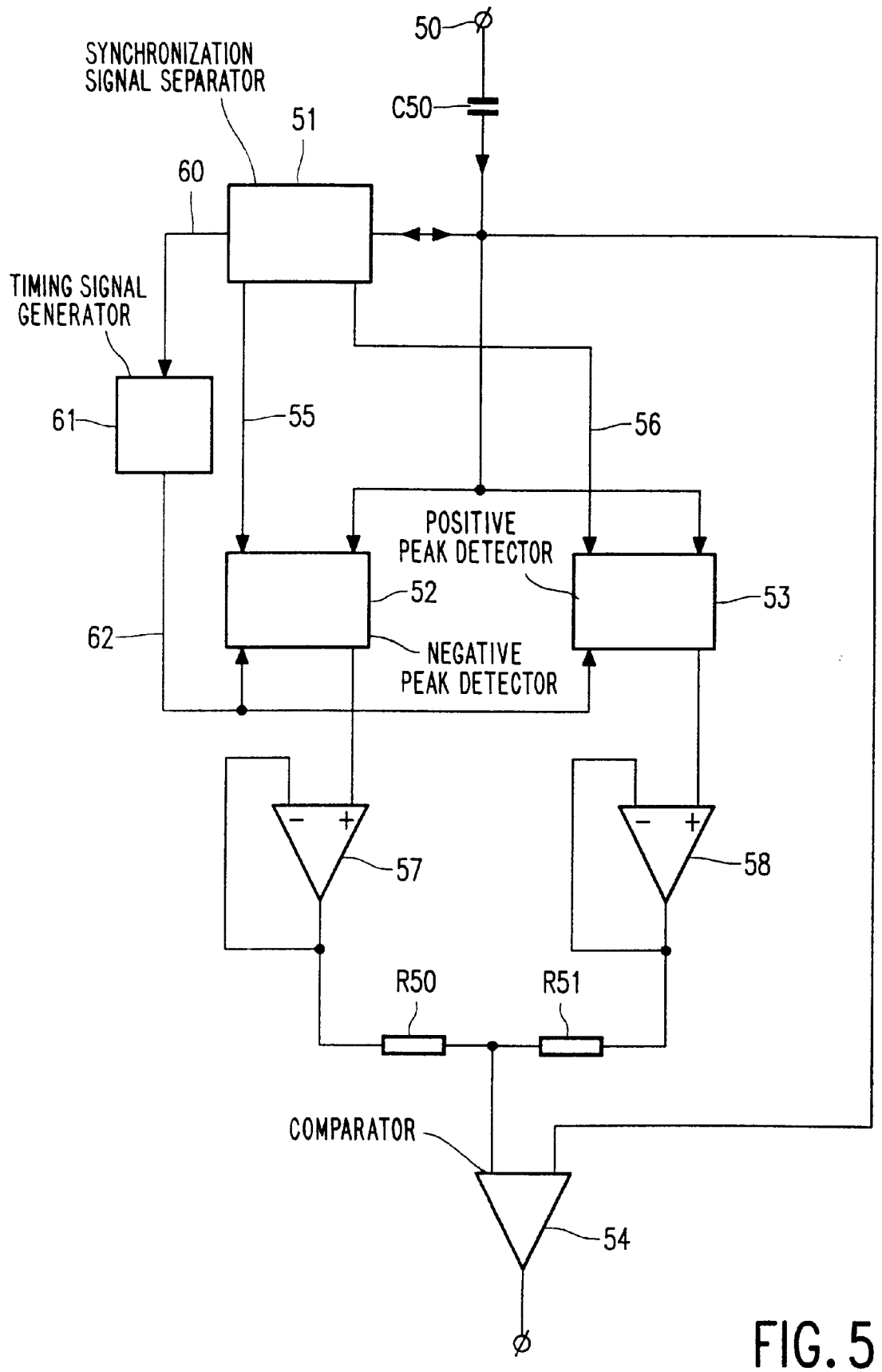
FIG. 5 shows a data slicer using peak detector circuits as shown in FIG. 4.

FIG. 5 shows how the positive and negative peak detectors may be used to produce a data slicing circuit for a teletext signal. As shown in FIG. 5, an input 50 is connected via a capacitor C50 to the input of a synchronization signal separator 51, to a first input of a negative peak detector 52, to a first input of a positive peak detector 53, and to a first input of a comparator 54. A first output of the synchronisation signal separator 51 is connected to a second input of the negative peak detector 52 via a line 55, while a second output of the synchronisation signal separator 51 is connected to a second input of the positive peak detector 53 via a line 56. The output of the negative peak detector 52 and positive peak detector 53 are buffered by amplifiers 57 and 58 respectively and fed to either end of a potential divider formed by resistors R50 and R51. The centre tap of resistors R50 and R51 is connected to a second input of the comparator 54. The output of the comparator 54 is fed to an output 59 of the data slicer and produces the data output.

In operation a CVBS signal is applied to input 50 and the synchronisation signal separator 51 will separate the line and field synchronisation signals and will also generate the voltages $V_{ref}n$ and $V_{ref}p$ which are applied over lines 55 and 56 to the negative and positive peak detectors 52 and 53, respectively. The synchronisation signal separator 51 produces a third output on line 60 which is fed to a timing signal generator 61 which generates, amongst other things, timing signals for operating the switches in the negative peak detector 52 and positive peak detector 53. These timing signals are fed a to third input of the peak detector circuits 52 and 53 over a line 62.

By detecting the positive and negative peaks of the clock run-in and data signals it is possible to find a data slicing level midway between the two peaks. This data slicing level is fed from the tapping point on the potential divider R50, R51 to the input of the comparator 54. Thus the input CVBS signal is compared with the data slicing level and an appropriate data output is obtained from the output of the comparator 54.

As an alternative to the analogue implementations of the peak detectors shown in FIGS. 1 to 4, a digital implementation using the same principle of a fast convergence to near the peak of the signal and a slower convergence thereafter may be constructed.

Figure 6:
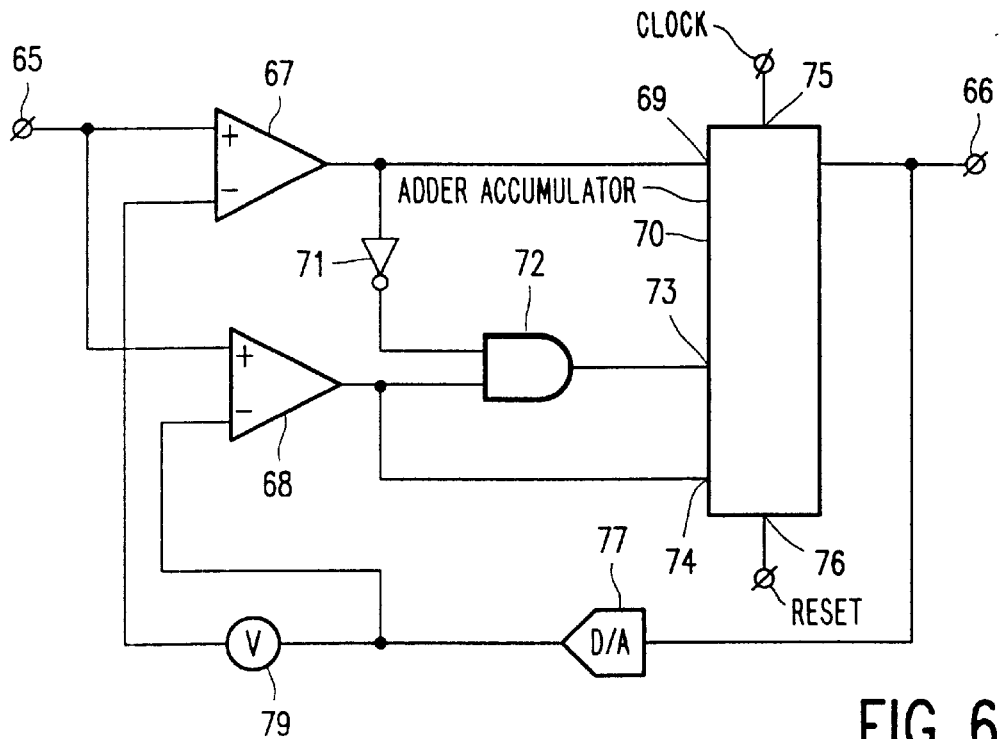
FIG. 6 shows a second embodiment of a peak detector circuit according to the invention.

FIG. 6 shows a first embodiment of such a digital version of a peak detector circuit according to the invention. As shown in FIG. 6, the peak detector has an input 65 and an output 66. The input 65 is connected to a first input of a first comparator 67 and to a first input of a second comparator 68. The output of the first comparator 67 is fed to a first input 69 of an adder accumulator 70. The output of the first comparator 67 is further fed through an inverter 71 to a first input of an AND gate 72. The output of the second comparator 68 is fed to a second input of the AND gate 72 while the output of the AND gate 72 is fed to a second input 73 of the adder accumulator 70. The output of the comparator 68 is further fed to a third input 74 of the adder accumulator 70. The adder accumulator has a fourth input 75 to which a clock signal is applied and a fifth input 76 to which a reset input is applied. The output of the adder accumulator is fed to the output 66 and to an input of a digital to analog converter 77. The output of the digital to analog converter 77 is fed to a second input of the comparator 68 and via a voltage generator 79 to the second input of the comparator 67.

In operation the state of the adder accumulator will be reset by means of the signal applied to the input 76 during portion a of the $C_p$ $V_s$ signal. The adder accumulator 70 may be either reset to zero or to a pre-set number by means of the signal at the input 76. This pre-set number can perform the same function as the pre-charge input in the analog version. When the adder accumulator is reset the digital to analog converter 77 will provide a voltage at the second input of the comparators 67 and 68, the input at the comparator 67 having the offset voltage generated by the offset voltage generator 79 added to it. If the input at input 65 has a value which is greater than that produced by the output of the digital to analog converter 77 plus the offset produced by the offset generator 79, then the output of the comparator 67 will be high and cause a number N which is greater than 1 to be added to the total in the accumulator 70, that is a high value at input 69 of the adder accumulator 70 will cause a number greater than 1 to be added to the number in the accumulator. At the same time, the output of the second comparator 68 will also be high and will apply an enable signal to input 74 of the adder accumulator 70, thus enabling the addition which will be carried out under the control of the clock signal applied to the input 75. This will cause the output of the accumulator to be increased and this will then be re-converted by the digital to analog converter 77 and consequently produce a higher analog voltage on the second inputs of the comparators 67 and 68. When the amplitude of the signal at the second input of the comparator 67 reaches that of the input signal, the output of the comparator 67 goes low and that of comparator 68 remains high, assuming that the input signal still remains above the magnitude of that produced at the output of the digital to analog converter 77. Under these circumstances, the signal at the first input of the AND gate 72 goes high because of the action of the inverter 71 and hence the signal at the output of the AND gate 72 goes high and this is applied to the adder accumulator 70 at its input 73. This causes a single digit accumulation of the total in the accumulator and a single digit is added at each clock cycle until the magnitude of the input at the second input of the second comparator 68 reaches that of the input signal. At this stage the output of the second comparator goes low and the signal at the input 74 goes low, thus disabling any further additions to the accumulator total, thus the accumulator now stores the peak value of the input signal.

Figure 7:
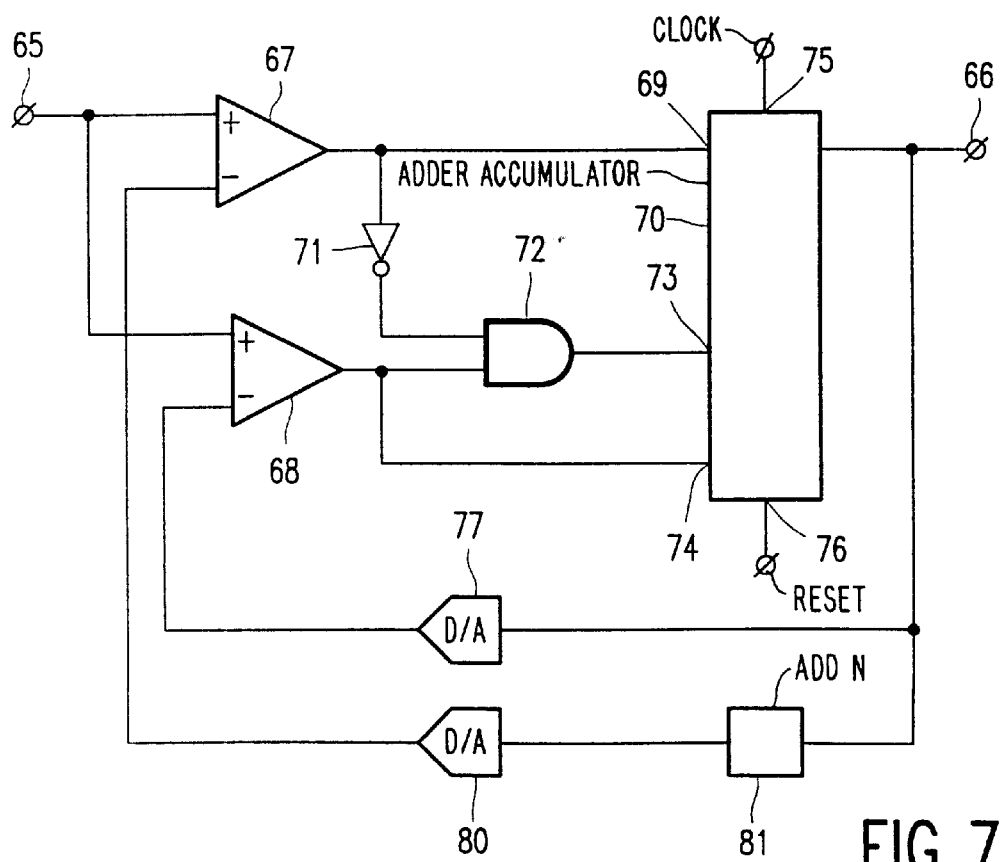
FIG. 7 shows a third embodiment of a peak detector circuit according to the invention.

FIG. 7 shows an alternative arrangement for generating the offset for the first comparator 67. In FIG. 7, those elements having the same form and functions as those in FIG. 6 have been given corresponding reference labels. The modification of FIG. 7 is to provide a second digital to analog converter 80 and an offset generator in the digital domain comprising an adder 81 which adds a fixed value N to the output of the accumulator 70 before it is applied to the digital to analog converter 80.

Figure 8:
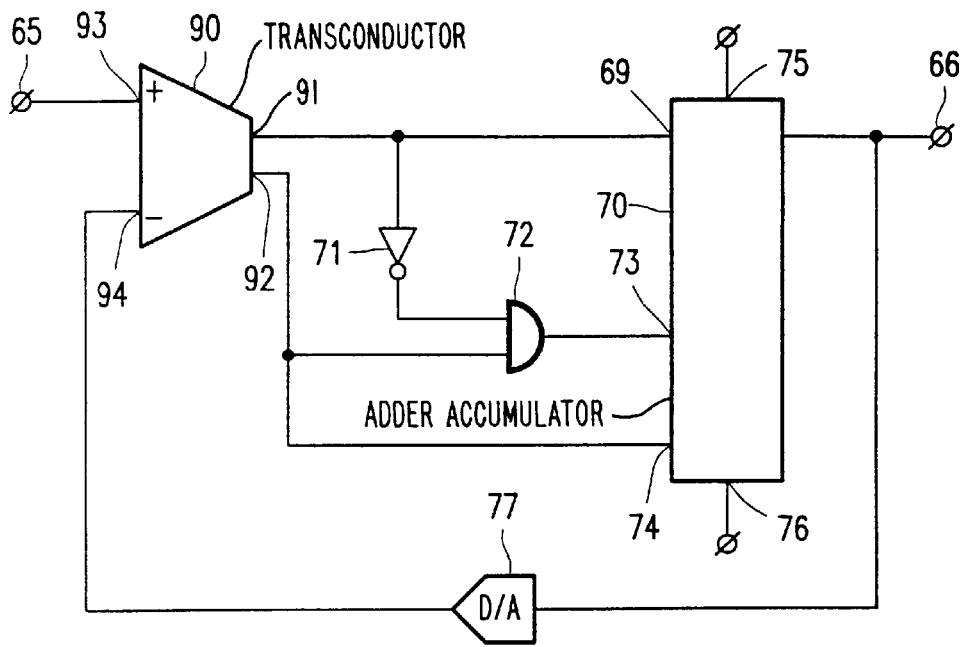
FIG. 8 shows a fourth embodiment of a peak detector circuit according to the invention.

FIG. 8 is a modification of the arrangement shown in FIG. 6 which enables the use of a single comparator having two outputs. In this arrangement the comparator 90 takes the place of the first and second comparators 67 and 68. The comparator 90 has a first output 91 which is connected to the input 69 of the adder accumulator 70 and a second output 92 which is connected to the second input of the AND gate 72 and to the input 74 of the adder accumulator 70. In operation the comparator 90 produces first and second outputs which have a fixed offset between their switching points. This provides the advantage that although a separate offset generator needs to be provided, a single comparator can be used thus the input signal 65 is connected to a first input 93 of the comparator 90 while the output from the digital to analog converter 77 is connected to a second input 94 of the comparator.

Figure 9:
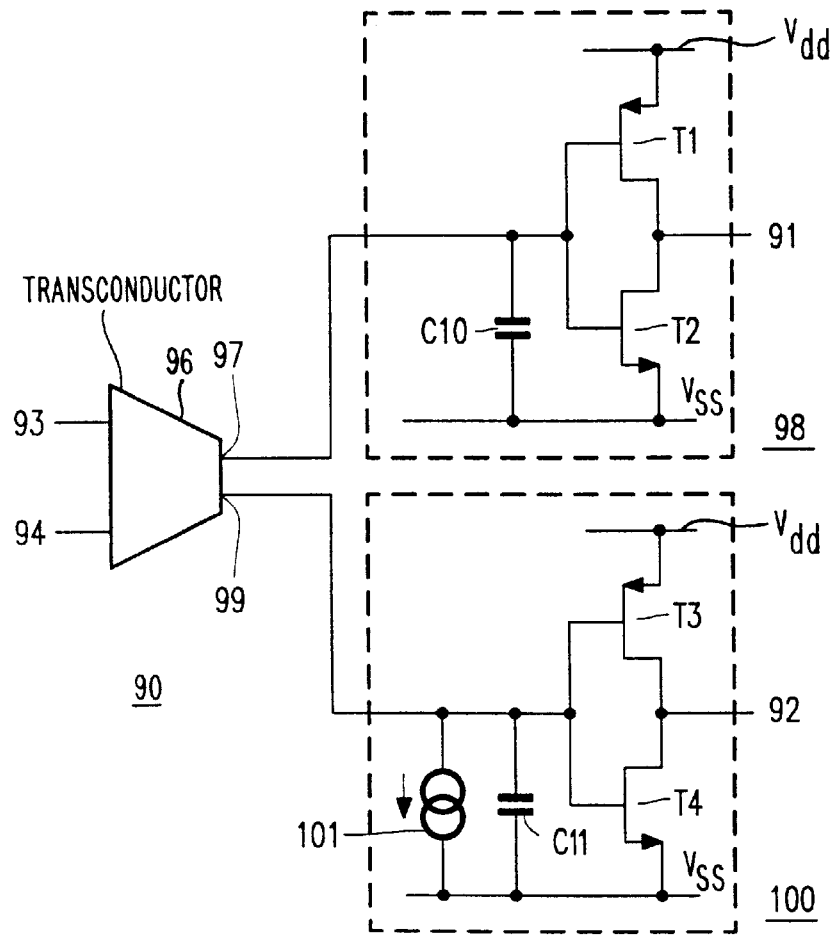
FIG. 9 shows a comparator circuit for use in the peak detector circuit of FIG. 8.

FIG. 9 illustrates a form which the comparator 90 may take. As shown in FIG. 9, the inputs 93 and 94 are connected to a transconductance stage 96. A first output 97 of the transconductance stage 96 is connected to the input of an inverter 98 while a second output 99 of the transconductance stage 96 is connected to a second inverter 100. The first inverter 98 comprises a p-channel field-effect transistor T1 and an n-channel field-effect transistor T2 connected in series across the power supply rails $V_{ss}$ and $V_{dd}$. The drain electrodes of transistors T1 and T2 are common and connected to the output 91 of the inverter 90 while the gate electrodes of transistors T1 and T2 are common and connected to the output 97 of the transconductance stage 96. In a similar manner the inverter 100 comprises a p-channel field-effect transistor T3 and an n-channel field-effect transistor T4 connected between the supply rails $V_{dd}$ and $V_{ss}$. The drain electrodes of transistors T3 and T4 are connected to the output 92 of the comparator 90 while the gate electrodes of transistors T3 and T4 are connected to the output 99 of the transconductance stage 96. A current source 101 is connected between the gate electrodes of transistors T3 and T4 and the supply rail $V_{ss}$. Parasitic capacitances C10 and C11 exist between the gate electrode of transistor T2 and the supply rail $V_{ss}$ and the gate electrode of transistor T4 and the supply rail $V_{ss}$ respectively.

In operation the output 99 of the comparator 96 is arranged to be $I_{out}/n$ while the output at output 97 is $(n-1)I_{out}/n$. If the current conducted by the current sink 101 is $I_{offset}$ then there will be an offset at the output 92 which is equal to $n \times I_{offset}/gm$, where gm is the transconductance of the stage 96.

Thus, by using the arrangement shown in FIGS. 8 and 9, the use of two separate comparators together with an explicit voltage source difference between the inputs applied to them can be reduced to a comparator having two outputs with a fixed offset voltage between the two switching points. In this arrangement chip area can be saved by using a fixed current source at the output of the transconductor to change the effective switching points of the inverters.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any claim and whether or not it mitigates any or all of the same technical problems as does the present invention.

I claim:

1. A peak detector for detecting the peak amplitude of an input signal, the peak detector comprising: storage means for storing a value representing a currently detected peak amplitude, means for detecting whether the input signal amplitude exceeds the stored value, means coupled to the storage means for updating the stored value at a first rate if the input signal amplitude exceeds the stored value by more than a given value, and the means for updating updates the stored value at a second slower rate if the input signal amplitude exceeds the stored value by less than the given value.

2. A peak detector as claimed in claim 1 in which the input signal has a nominal peak value and the given value is between 10% and 30% of the nominal peak value of the input signal.

3. A peak detector as claimed in claim 1, the means for detecting comprising a differential pair of transistors, the storage means including a capacitor, means for applying the input signal to a control electrode of the first transistor, means for connecting the capacitor between a control electrode of the second transistor and a first supply rail, means for charging the capacitor to a voltage at a rate determined by the current conducted by the main current path of the second transistor, and the updating means includes further charging means for providing a further charging current for the capacitor when the input signal voltage exceeds the voltage across the capacitor by more than the given value.

4. A peak detector as claimed in claim 3 in which the further charging means comprises a further transistor connected between a second supply rail and the capacitor, said further transistor being controlled to supply a charging current to the capacitor when the input signal voltage exceeds the voltage across the capacitor by the given value.

5. A peak detector as claimed in claim 4 in which the first transistor has a constant current source load and is further connected to a control electrode of the further transistor, the further transistor becoming conductive when the first transistor attempts to conduct a current greater than that produced by the constant current source.

6. A peak detector as claimed in claim 1 in which the storage means comprises an accumulator, and the means for updating the stored value at the first rate comprises means for adding a first number N to the accumulator and for updating the stored value at the second rate comprises means for adding a second number M to the accumulator, where N>M.

7. A peak detector as claimed in claim 6 in which M=1.

8. A peak detector as claimed in claim 6, the means for detecting comprising first and second comparators, means for feeding the input signal to first inputs of the first and second comparators, means for feeding the output of the accumulator to a second input of the second comparator, means for adding the given value to the output of the accumulator and feeding it to the second input of the first comparator, the means for adding N to the accumulator being active when the input signal is greater than the signal at the second input of the first comparator, and the means for adding M to the accumulator being active when the input signal is greater than the signal at the second input of the second comparator and less than the signal at the second input of the first comparator.

9. A peak detector as claimed in claim 6 further comprising a digital to analog converter coupling an output of the accumulator to input means of the accumulator via the detecting means.

10. A peak detector as claimed in claim 6 comprising first and second digital to analog converters, the output of the accumulator being converted by the first digital to analog converter, means for adding the given value to the output of the accumulator and applying it to the second digital to analog converter, and means for applying outputs of the first and the second digital to analog converter to input means of the accumulator via the detecting means.

11. A peak detector as claimed in claim 6, the means for detecting comprising a comparator having first and second inputs and first and second outputs, the first and second outputs having separate switching points dependent on different input voltage differences between the two inputs, the first output causing the number N to be added to the accumulator and the second output causing the number M to be added to the accumulator.

12. A peak detector as claimed in claim 11 in which the comparator comprises a transconductance stage having first and second current outputs, first and second transimpedance stages each comprising an inverter, and an offset generator comprising a current sink which sinks a fixed current from the second output of the transconductance stage.

13. A data slicer comprising: means for feeding an input signal to a first, positive, peak detector and to a second, negative, peak detector, means for generating a slicing level intermediate the positive and negative peak values, and means for comparing the input signal with the slicing level and producing a data signal from said comparison; wherein the first and second peak detectors each comprise peak detector as claimed in claim 1.

14. A teletext decoder including a peak detector as claimed in claim 1.

15. A peak detector as claimed in claim 8 in which the output of the accumulator is fed to the first and second comparators via a digital to analog converter.

16. A peak detector as claimed in claim 8 comprising first and second digital to analog converters, the output of the accumulator being converted by the first digital to analog converter and fed to the second input of the second comparator, means for adding the given value to the output of the accumulator and applying it to the second digital to charged converter, and means for applying the output of the second digital to analog converter to the second input of the first comparator.

17. A data slicer comprising: means for feeding an input signal to a first, positive, peak detector and to a second, negative, peak detector, means for generating a slicing level intermediate the positive and negative peak values, and means for comparing the input signal with the slicing level and producing a data signal from said comparison; wherein the first and second peak detectors each comprise a peak detector as claimed in claim 6.

18. A teletext decoder including a data slicer as claimed in claim 13.

19. A peak detector as claimed in claim 8 wherein M=1.

20. A peak detector as claimed in claim 9 wherein M=1.

21. A peak detector as claimed in claim 6 wherein the input signal has a nominal peak value and the given value is between 10% and 30% of the nominal peak value of the input signal.

* * * * *